137-13. OR 3,193,197 SR

SEARCH ROOM

July 6, 1965 P. BAUER 3,193,197

BINARY COUNTER STAGES HAVING TWO FLUID VORTEX AMPLIFIERS

Filed April 23, 1962 2 Sheets-Sheet 1

INVENTOR
PETER BAUER

BY Griffin and Stokes
ATTORNEYS

BINARY COUNTER STAGES HAVING TWO FLUID VORTEX AMPLIFIERS

Filed April 23, 1962 2 Sheets-Sheet 2

United States Patent Office 3,193,197

Patented July 6, 1965

3,193,197

BINARY COUNTER STAGES HAVING TWO FLUID VORTEX AMPLIFIERS

Peter Bauer, Ambler, Pa., assignor to Sperry Rand Corporation, New York, N.Y., a corporation of Delaware Filed Apr. 23, 1962, Ser. No. 189,524
30 Claims. (Cl. 235—201)

The present invention relates to bistable devices of the type suitable for use as binary counters. More particularly, the present invention provides pure fluid devices of the bistable type which switch from one stable state to the other in response to each pulse received at a single input. The invention comprises a modulo-2 counter having two fluid vortex amplifiers interconnected such that the output from each amplifier controls the power stream of the other amplifier.

Electronic and electromechanical computers are well known in the art. Many of these devices are sensitive to environment conditions such as temperature and humidity. Others are fragile or subject to wear. The development of the fluid amplifier has resulted in the construction of computers and control devices which are quite rugged and are relatively insensitive to environment conditions. These devices operate on fluid principles and employ no moving parts other than the working fluid. In copending application Serial No. 135,824, filed September 5, 1961, I disclose improved fluid amplifiers in which a so-called power stream is maintained in a first or a second stable state of flow under the influence of a circulating fluid flow or vortex created by the power stream. Such amplifiers are called vortex amplifiers.

An object of the present invention is to provide a bistable counter comprising two vortex amplifiers as described above and suitable for use in a fluid operated system.

An object of this invention is to provide two vortex amplifiers and means for interconnecting the amplifiers whereby each produces fluid signals for controlling the other, said amplifiers being inter-connected whereby each fluid pulse applied to one amplifier causes the other amplifier to change from one stable state to the other.

A feature of the invention is the provision of a first embodiment having first and second vortex amplifiers each having a power stream input channel, an output channel, and a vortex chamber connecting the input channel to the output channel in a region intermediate the ends of the output channel. A source of intermittent fluid pulses is connected to the power stream input channel of the first amplifier and the power stream input channel of the second amplifier is connected to a source which provides an uninterrupted stream of fluid. In this embodiment the second amplifier is provided with first and second control signal channels connected to the ends of the output channel of the first amplifier and terminating at orifices in opposing walls of the vortex chamber so that the output signals from the first amplifier deflect the power stream of the second amplifier. The signals in the output channel of the second amplifier indicate the state of the amplifier. In addition, a portion of the signals appearing in the output channel of the second amplifier is applied by way of a fluid conducting means to the ends of the output channel of the first amplifier to thereby determine the direction in which fluid pulses applied to the input channel of the first amplifier enter its output channel.

A further object of the invention is to provide the multistage binary counter wherein each stage comprises a pair of vortex amplifiers connected as described above, the output channel of the second amplifier in each stage except the last being connected to the power stream input channel of the first amplifier in the next higher order stage.

A further feature of the invention present in a second embodiment is the provision of first and second amplifiers each having a power stream input channel, an output channel, a vortex chamber connecting the input channel to the output channel in the region intermediate the ends of the output channel, and a pair of control stream input channels terminating at orifices in opposing walls of the vortex chamber. Means are provided for connecting the ends of the output channel of each amplifier to the control stream input channels of the other. Further means are provided for applying a continuous stream of fluid to the power stream input channel of the second amplifier and applying intermittent fluid pulses to the power stream input channel of the first amplifier whereby said second amplifier is changed from one stable state to the other in response to each of the intermittent fluid pulses.

Still another object of the invention is to provide a multistage binary counter wherein each stage comprises a pair of vortex amplifiers connected as described in the preceding paragraph, means being provided for connecting the output channel of the second amplifier in each stage except the last to the power stream input channel of the first amplifier in the next higher order stage.

A further object of the invention is to provide novel methods for applying signals to bistable fluid amplifiers. In one method, the power stream is intermittently terminated and then initiated. Prior to the initiation of the power stream a control signal is applied to the amplifier through a control signal input channel to set up a control flow of sufficient magnitude to determine the direction in which the power stream will flow when initiated. The magnitude of the control signal is less than that required to change a power stream already flowing in one stable path of flow to the other stable path of flow. The control signal may be applied either before or after the power stream is terminated but must be present at the instant the power stream is initiated.

In a second method, a pulsating power stream is employed but the control signal is applied through an output channel to the chamber of a vortex amplifier to create a control vortex flow of small magnitude. This control vortex is of sufficient magnitude to influence the direction of flow of the power stream at the instant the power stream starts to flow. However, the magnitude of the control signal is insufficient to switch the power stream from one stable state of flow to the other. The control signal may be applied either before or after the power stream is terminated but must be present at the instant the power stream is initiated.

A further object of this invention is to provide a novel combination of elements for carrying out the above methods.

Other objects of the invention and its mode of operation will become apparent upon consideration of the following description and the accompanying drawings in which.

It should be understood that the term channel as used herein refers to a closed channel, duct, pipe or other closed means for conveying fluid under a pressure different from that of the external environment. The fluid may be air or another gas or water or another liquid either with or without particles entrained therein. The accompanying FIGURES 1 and 3 do not show the specific construction of such channels but merely indicate the necessary paths of fluid flow. A suitable construction for such channels and the vortex amplifiers is shown in my aforementioned application to which reference may be made. Physical constructions other than that shown in my copending application are equally suitable in practicing the present invention.

Figure 1:
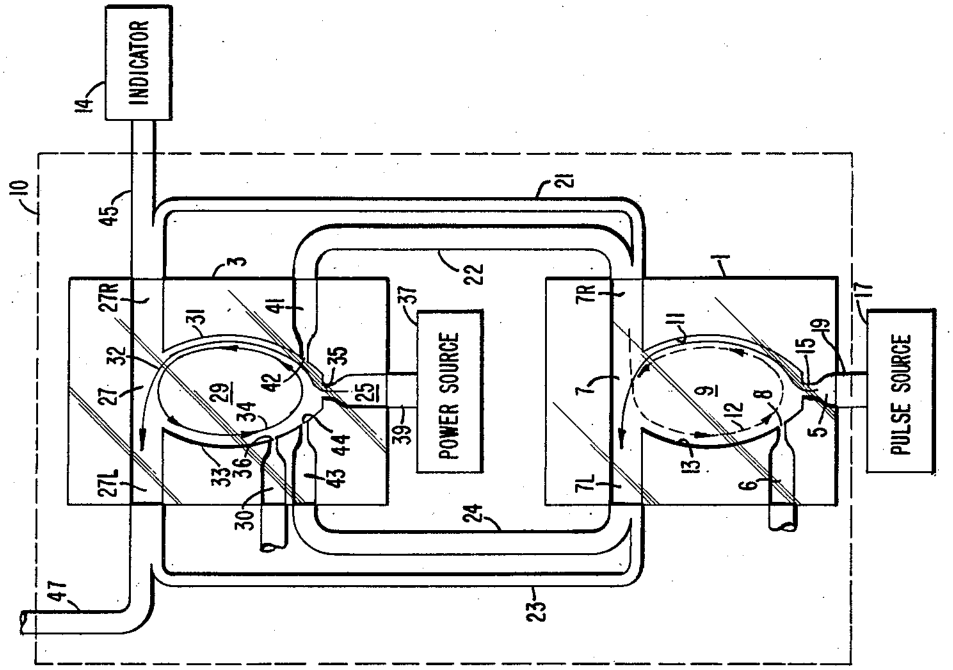
FIGURE 1 shows a first embodiment of the invention which switches from one stable state to the other in response to each fluid input pulse.

FIGURE 1 shows a single stage or modulo-2 counter comprising a first vortex amplifier 1 and a second vortex amplifier 3. Amplifier 1 comprises a power stream input channel 5 and an output channel 7 interconnected by a vortex chamber 9 defined by opposing walls 11 and 13. The longitudinal axis of output chanel 7 is substantially perpendicular to the path of flow of a fluid stream passing through channel 5 and entering chamber 9 through orifice 15.

Reference numeral 17 designates a source which intermittently produces fluid pulses and may be a fluid pulse generator of conventional design. Fluid conveying means 19 conveys the pulses generated by source 17 to input channel 5 from whence they pass through orifice 15 and chamber 9 and strike the wall of the output channel. Assuming perfect symmetry each pulse striking the wall of the output channel divides equally with half of the fluid flowing into the leg 7L and the other half flowing into the leg 7R.

As explained in my aforementioned application, perfect symmetry cannot be obtained and any slight imbalance of force against the power stream issuing from orifice 15 causes all of the power stream to flow into either leg 7L or 7R. In amplifier 1 the direction of fluid flow in legs 7L and 7R is utilized to create an imbalanced force to control the direction of flow of the power stream into the output channel. When amplifier 3 is in one stable state its power stream flows into leg 27R of its output channel and a portion of this fluid is conveyed by way of channel 21 to the leg 7R of the output channel of amplifier 1. A part of the fluid entering leg 7R flows directly into leg 7L while the remainder splits off, enters chamber 9, and flows in a counterclockwise direction down wall 13, across orifice 15, and up wall 11 as indicated by the directional arrow 12. The resulting counterclockwise vortex flow passes directly in front of orifice 15 so when a pulse from source 17 causes a power stream to issue from the orifice the power stream flows along wall 11 and into the left leg 7L of the output channel. The direction of flow of the power stream is indicated in part by the arrow 14. As subsequently explained, a portion of the power stream recirculates in a counterclockwise vortex flow within chamber 9 as long as the power stream continues to issue from orifice 15. This vortex flow causes the power stream to maintain its direction of flow along wall 11.

On the other hand, when amplifier 3 is in a second stable state its power stream flows into leg 27L of its output channel and a portion of this fluid is conveyed by means of channel 23 to the left leg 7L of the output channel of amplifier 1. A part of the fluid entering leg 7L flows directly into leg 7R while the remainder splits off, enters chamber 9, and flows in a clockwise direction down wall 11, across orifice 15, and up wall 13. The resulting clockwise vortex flow passes directly in front of orifice 15 so when a pulse from source 17 initiates power stream flow from the orifice the power stream flows along wall 13 and into the right leg 7R of the output channel. Again, a portion of the power stream recirculates in the chamber 9. However, the direction of vortex flow is clockwise thus causing the power stream to flow along wall 13 and into leg 7R as long as the power stream is maintained.

In some instances it is desirable to provide means for resetting amplifier 1 so that a power stream flowing therein may be made to flow along wall 11 and into leg 7L of the output channel. A control stream input channel terminating at orifice 8 in the wall 13 may be provided for this purpose. The channel 6 is connected to a source which emits a fluid signal upon occurrence of given condition such as the occurrence of a reset command or the depression of a reset key. When fluid is applied to channel 6 it emerges from orifice 8 at a high velocity and strikes the power stream if one is present in the chamber 9. This deflects the power stream such that it flows along wall 11 and into channel 7L. A portion of the power stream sets up a vortex within the chamber 9 to maintain the power stream in this state even after the reset signal is terminated.

Vortex amplifier 3 is similar to vortex amplifier 1 in that it has a power stream input channel 25, an output channel 27, and a vortex chamber 29 defined by walls 31 and 33. A power source 37 continuously produces a stream of fluid which is conveyed by means of channel 39 to the power stream input channel 25 from whence it passes through orifice 35 into the vortex chamber. Power source 37 may be a pump or compressor of conventional design and preferably includes a regulating means such that the fluid applied to channel 39 is under a substantially constant pressure.

As stated before, any lack of symmetry in the vortex chamber of a vortex amplifier produces an imbalance of pressures acting against the sides of the power stream and it is deflected to one wall of the vortex chamber. Assume for purposes of illustration that a power stream is applied to channel 25 and because of the lack of symmetry the power stream is deflected toward the wall 31. Once deflected toward wall 31 the power stream flows along this wall as indicated by the directional arrow 32 and then flows into leg 27L of the output channel. All of the power stream does not flow into leg 27L. The contour of wall 31 is such that a portion of the power stream is diverted to set up a vortex flow. This portion of the power stream flows in a counterclockwise direction around the vortex chamber as indicated by the arrow 34 and causes the power stream issuing from orifice 35 to continue to flow along wall 31. As explained in my copending application this condition is maintained as long as the power stream flows from orifice 35 and no control signal is applied to the vortex chamber.

Fluid control signals are introduced into the vortex chamber through control stream input channels 30, 41 and 43 which terminate at orifices 36, 42 and 44, respectively. Assume that the power stream emerging from orifice 35 is flowing along wall 31 and into leg 27L. A control stream applied to channel 41 at this time emerges from orifice 42 and strikes the power stream thus imparting momentum to the power stream and deflecting it toward the wall 33. The power stream emerging from orifice 35 now flows along wall 33 and into the right leg 27R of the output channel. In addition, a portion of the power stream is diverted by the contour of wall 33 to set up a vortex flow in a clockwise direction in the chamber 29. Once the vortex has been established by the power stream, the vortex maintains the power stream in its deflected path of flow along wall 33 even after the fluid control signal at orifice 42 is terminated.

In like manner, a fluid control signal applied to channel 43 emerges from orifice 44 and strikes the power stream emerging from orifice 35 and deflects it toward the wall 31 from whence it flows into the left leg 27L of the output channel with a portion of the power stream being diverted to create a counterclockwise vortex flow which maintains the power stream in this path of flow after the signal from orifice 36 or 44 is terminated. It is seen, therefore, that the amplifier 3 has two stable states of flow. A control stream issuing from orifice 42 deflects the power stream so that it flows into channel 27R with this condition of flow being maintained even after the control stream ceases. This is referred to as the "set" state of the amplifier. Subsequent application of a control stream to channel 30 or 43 deflects the power stream so that it flows into output channel 27L with this condition being maintained through the vortex action even after the control stream ceases to flow in channel 43. This is referred to as the reset state of the amplifier.

Channels 45 and 47 may be utilized to sense the state of amplifier 3. If the power stream is flowing into channel 27R this condition is evidenced by fluid flow in channel 45 and if the power stream is flowing into the channel 27L this condition is evidenced by fluid flow in channel 47. The variations in fluid flow in channels 45 and 47 causes variations in the pressures therein. These pressures may be used to control another bistable device or an indicator 14.

All of the fluid flowing in channel 27R does not enter channel 45. A relatively small portion of the fluid is conveyed by means of channel 21 to the leg 7R of amplifier 1. The purpose of this feedback is to influence the direction in which a power stream emerging from orifice 15 flows into the output channel 7. As explained above, when amplifier 3 is set a portion of the fluid flowing in channel 27R is conveyed by means of channel 21 to the channel 7R. A portion of the fluid entering channel 7R enters chamber 9, flows down wall 13, and across orifice 15. Therefore, upon initiation of flow through the chamber 9 the power stream flows along wall 11 and into the channel 7L.

On the other hand, if amplifier 3 is reset a portion of the fluid flowing in channel 27L is conveyed by means of channel 23 to the channel 7L. A portion of the fluid entering channel 7L enters chamber 9, flows down wall 11 and across orifice 15. If a power stream is initiated at this time it flows along wall 13 and into channel 7R.

It should be noted that the channels 21 and 23 convey only a small portion of the fluid flowing in channels 27R and 27L since only a slight flow across orifice 15 is sufficient to influence the direction of flow of the power stream when it is first initiated. The amount of fluid flowing through channel 21 or channel 23 is adjusted such that the resulting flow across orifice 15 is sufficient to influence the direction of flow of the power stream of amplifier 1 when it first begins to flow but is insufficient to change the direction of flow of the power stream once it has begun to flow into either channel 7L or 7R.

The modulo-2 counter shown in FIGURE 1 functions as follows. Assuming amplifier 3 is reset, the power stream from source 37 flows through vortex chamber 29 and into output channel 27L. A major portion of the fluid flowing into channel 27L flows out through channel 47 to indicate that amplifier 3 is in the reset state. A minor portion of the fluid flowing in channel 27L is conveyed by means of channel 23 to channel 7L of amplifier 1 thus causing fluid flow from right to left across orifice 15. Assume now that pulse source 17 generates a first fluid pulse. This pulse causes a fluid power stream to issue from orifice 15 and because the flow across orifice 15 is from right to left the power stream flows along wall 13 and into channel 7R.

A portion of the power stream does not enter channel 7R but recirculates in a clockwise direction in chamber 9 thus causing the power stream issuing from orifice 15 to flow along the wall 13 as long as the power stream exists.

A major portion of the fluid flowing in channel 7R is conveyed by means of channel 22 to the control stream input channel 41 of amplifier 3. The resulting control stream issuing from orifice 42 deflects the power stream from orifice 35 toward the wall 33 and the power stream flows along this wall and into the output channel 27R. At the time the power stream of amplifier 3 switches from channel 27L to channel 27R fluid stops flowing in channel 47 and begins to flow in channel 45 thus indicating that amplifier 3 is set. At the same time, fluid stops flowing in channel 23 and begins to flow in channel 21. If the first fluid pulse has terminated and no power stream is issuing from orifice 15 a portion of the fluid flowing in channel 21 enters chamber 9 and flows from left to right in front of the orifice to influence the direction of flow of the power stream when it is again initiated by source 17. On the other hand, if the first fluid pulse has not terminated and the power stream is issuing from orifice 15, the fluid flowing in channel 21 has no discernible effect on the power stream because the amount of fluid flowing through channel 21 is relatively small.

Because the influence of fluid flowing in channels 21 and 23 is so slight the duration of fluid pulses from source 17 is not critical and the pulses may be terminated by source 17 either before or after fluid flow in channels 21 and 23 changes. However, once source 17 terminates a pulse and the power stream ceases to flow through orifice 15 the fluid flow through channel 21, into channel 7R and across orifice 15 is sufficient to cause the power stream of amplifier 1 to flow into channel 7L the next time it is initiated.

Fluid may also flow from output channels 7L and 7R to output channel 27L or 27R when the power stream of amplifier 1 begins to flow. However, the flow is so slight as to have no controlling effect on the power stream of amplifier 3 since this power stream flows continuously.

The second pulse generated by source 17 again causes a power stream to issue from orifice 15 and because fluid is flowing from left to right across the orifice the power stream flows along wall 11 and enters channel 7L. A portion of the power stream recirculates in chamber 9 in a counterclockwise direction of flow to hold the power stream against wall 11 as long as the power stream exists.

A major portion of the fluid flowing in channel 7L enters channel 24, flows through control stream input channel 43 and emerges from orifice 44 to deflect the power stream of amplifier 3 toward the wall 31. This causes amplifier 3 to return to its original or reset state with a major portion of its power stream flowing into channel 27L. A portion of the power stream recirculates or maintains a counterclockwise vortex flow in the chamber 29 to hold the power stream against wall 31 until a control signal is received in channel 41.

From the above description it is seen that after two pulses are applied to amplifier 1 amplifier 3 is returned to its original state with the power stream flowing into channel 27L. A major portion of the fluid flowing in channel 27L enters channel 47 to indicate that amplifier 3 is reset and a minor portion of the fluid flowing into channel 27L enters channel 23 for the purpose of controlling the direction of power stream flow when the next input pulse is applied to amplifier 1.

Control signal input channel 30 is provided for resetting the amplifier 3 upon the occurrence of a predetermined condition. For example, channel 30 may be connected to a source of fluid pulses (not shown) which resets the amplifier before the pulses to be counted are applied by source 17. Preferably, channel 30 is connected to the same source of reset signals as the channel 6 of amplifier 1 so that both amplifiers are reset simultaneously.

Figure 2:
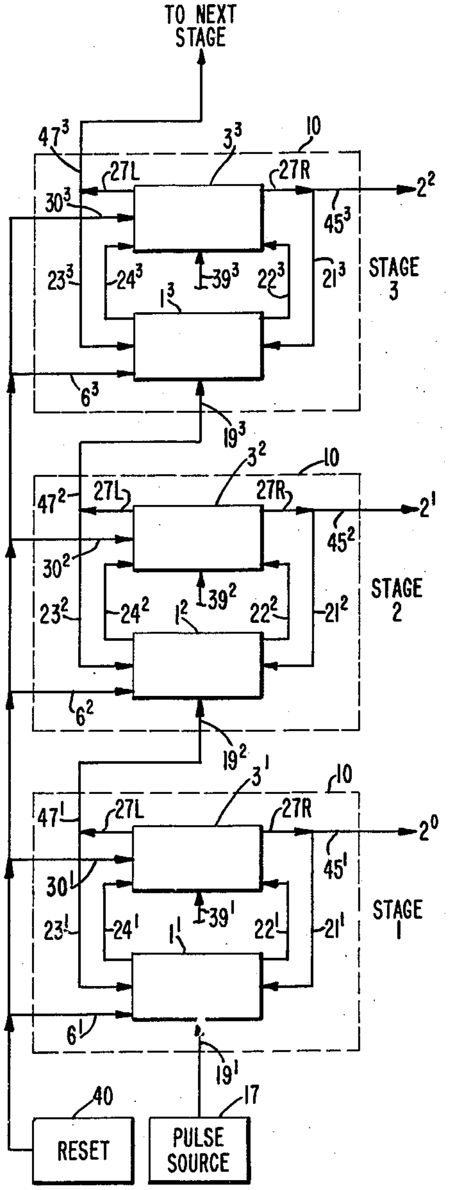
FIGURE 2 is a diagram illustrating the manner in which a plurality of stages such as that shown in FIGURE 1 may be serially connected to form a multistage binary counter.

FIGURE 2 shows one manner in which a plurality of modulo-2 counter stages of the type shown in FIGURE 1 may be serially connected to form a multistage binary counter. Only three stages are shown in FIGURE 2 but it will be obvious to those skilled in the art that additional stages may be added to increase the counting capacity of the counter.

The source of pulses to be counted is connected to the power stream input channel $\mathbf{19^1}$ of the amplifier $\mathbf{1^1}$ in stage 1. Power stream input channel $\mathbf{19^2}$ of the amplifier $\mathbf{1^2}$ in stage 2 is connected to the channel $\mathbf{47^1}$ of stage 1 while the power stream input channel $\mathbf{19^3}$ of the amplifier $\mathbf{1^3}$ is connected to channel $\mathbf{47^2}$. Output channel $\mathbf{47^3}$ may be connected to the next higher order stage or else connected to an output device to pulse the output device once for each eight pulses produced by pulse source 17.

The power stream input channels 39 of the amplifiers 3 in each stage are connected to a continuous power source such as that described with reference to FIGURE 1. Channels 45 of each stage of the counter may be connected to an indicating device for indicating the count in the counter.

The counter operates as follows. Assume that the counter is initially reset by applying a fluid reset signal to the control signal input channels 6 and 30 from source 40 so that the power stream of each of the amplifiers 1 flows into its corresponding output channel 7L and the power stream of each of the amplifiers 3 flows into its corresponding output channel 27L. Therefore, when the counter is in its reset condition and contains a count of zero the amplifier 3 in each stage has a major portion of its power stream directed over channel 47 to the power stream input of the amplifier 1 in the next higher order stage. A minor portion of the power stream of each of the amplifiers 3 is fed back by means of channel 23 to the amplifier 1 of the corresponding stage to control the direction of power stream flow the first time a power stream is initiated in the amplifier 1.

Assume now that the first pulse from source 17 is applied to the amplifier $1^1$. Because fluid is flowing in channel $23^1$ the power stream of amplifier $1^1$ is directed into channel $22^1$ and applied as a control stream to the amplifier $3^1$. The control stream from channel $22^1$ deflects the power stream of the amplifier $3^1$ so that it flows into the channel 27R. A major portion of the fluid entering channel 27R is applied by way of channel $45^1$ to an indicating device to indicate that the counter contains a count of one. A minor portion of the fluid flowing in channel 27R is conveyed by way of channel $21^1$ to the amplifier $1^1$ so that the next time a pulse is received from pulse source 17 the power stream of this amplifier will be directed toward channel $24^1$.

When the control stream on channel $22^1$ switches the power stream of amplifier $3^1$ to channel 27R fluid stops flowing in channels 27L, $23^1$ and $47^1$. Since no fluid flows in channel $47^1$ no power stream is applied to the amplifier $1^2$.

When pulse source 17 applies the second pulse to amplifier $1^1$ the operation is as follows. Because fluid is flowing in channel $21^1$ the power stream of amplifier $1^1$ is deflected so that it flows into channel $24^1$ and is applied to amplifier $3^1$ thus switching this amplifier so that its power stream flows into channel 27L. A minor portion of the fluid in channel 27L is fed back by way of channel $23^1$ to the amplifier $1^1$ but has no effect on the amplifier at this time.

A major portion of the fluid flowing in channel 27L passes through channel $47^1$ and enters amplifier $1^2$ as a power stream input pulse. Since amplifier $3^2$ was reset before the count began and has not changed since that time fluid is flowing in channel $23^2$ thus directing the power stream of amplifier $1^2$ into channel $22^2$. The fluid flowing in channel $22^2$ is applied to a control stream input of amplifier $3^2$ and deflects the power stream of this amplifier so that it flows into the channel 27R. A minor portion of the fluid flowing in channel 27R is fed back by way of channel $21^2$ to amplifier $1^2$ but has no effect at this time. A major portion of the fluid flowing in channel 27R is applied by way of channel $45^2$ to an indicating device to indicate that the counter now contains a count of $2^1$ or 2.

When the power stream of amplifier $3^2$ begins to flow into channel 27R fluid flow stops in channels 27L, $23^2$ and $47^2$ and no power stream is applied to the amplifier $1^3$. When pulse source 17 applies the third fluid pulse to the counter the operation is as follows. In stage 1 fluid is flowing in channel $23^1$ thus causing the power stream developed from the fluid input pulse to be directed into the channel $22^1$. The fluid flowing in channel $22^1$ is applied to a control stream input channel of amplifier $3^1$ thus deflecting the power stream of this amplifier so that it flows into channel 27R. Again, a minor portion of the fluid flowing through channel 27R is applied by way of channel $21^1$ to the amplifier $1^1$ but has no effect at this time while a major portion of the fluid flowing in channel 27R is applied by way of channel $45^1$ to an indicating device to indicate that the first stage of the counter is set to represent $2^0$ or 1.

When the power stream of amplifier $3^1$ flows into channel 27R fluid flow stops in channels 27L, $23^1$ and $47^1$. When fluid stops flowing in channel $47^1$ the power stream of amplifier $1^2$ also stops flowing. However, no further action takes place in stage 2 because of the bistable characteristic of the amplifier $3^2$. Since amplifier $3^2$ was set as a result of the second input pulse from source 17 fluid still flows through channel 27R and $45^2$ of stage 2. Therefore, the total count in the counter as evidenced by fluid flow in channel 45 of stages 1 and 2 is $2^0+2^1=1+2=3$.

Assume now that pulse source 17 applies a fourth pulse to the amplifier $1^1$. Since fluid is flowing in channel $21^1$ the power stream of amplifier $1^1$ is directed into channel $24^1$. The fluid flowing in channel $24^1$ is applied to a control stream input channel of amplifier $3^1$ and deflects the power stream of this amplifier so that it now flows into the channel 27L. The fluid in channel 27L of stage 1 passes through channel $47^1$ and is applied as a power stream input pulse to the amplifier $1^2$. Fluid is flowing in channel $21^2$ at this time so that the power stream of amplifier $1^2$ is directed into the channel $24^2$ and applied as a control stream to the amplifier $3^2$. This resets amplifier $3^2$ so that its power stream flows through channel 27L and $47^2$ and is applied as a power stream to the amplifier $1^3$. In stage 3 fluid is flowing through the channel $23^3$ so the power stream of amplifier $1^3$ is directed into channel $22^2$ applied as a control stream input to the amplifier $3^3$. This deflects the power stream of this amplifier so that it flows into the channel 27R. A minor portion of the fluid flowing in channel 27R is conveyed by means of channel $21^3$ to the amplifier $1^3$ but has no effect at this time. A major portion of the fluid flowing in channel 27R is conveyed by means of channel $45^3$ to an indicating device to indicate that stage 3 is set and the counter contains a count of $2^2$ or 4.

The mode of operation of the counter shown in FIGURE 2 in response to further pulses from source 17 is believed obvious. After seven pulses have been applied to the amplifier $1^1$ all of the amplifiers 3 will be in their set state with fluid flowing into the respective channels 27R. Therefore, when the counter contains a count of 7 fluid will flow in each of the channels 45 thus providing an indication that the counter contains a count of $$2^2+2^1+2^0=7$$

Furthermore, it is obvious that after the eighth pulse is received from source 17 the amplifiers 1 and 3 in each stage of the counter are returned to their zero or reset state and fluid again flows through channel 47 of stage 3 to be applied to the next stage of the counter if one is provided.

Figure 3:
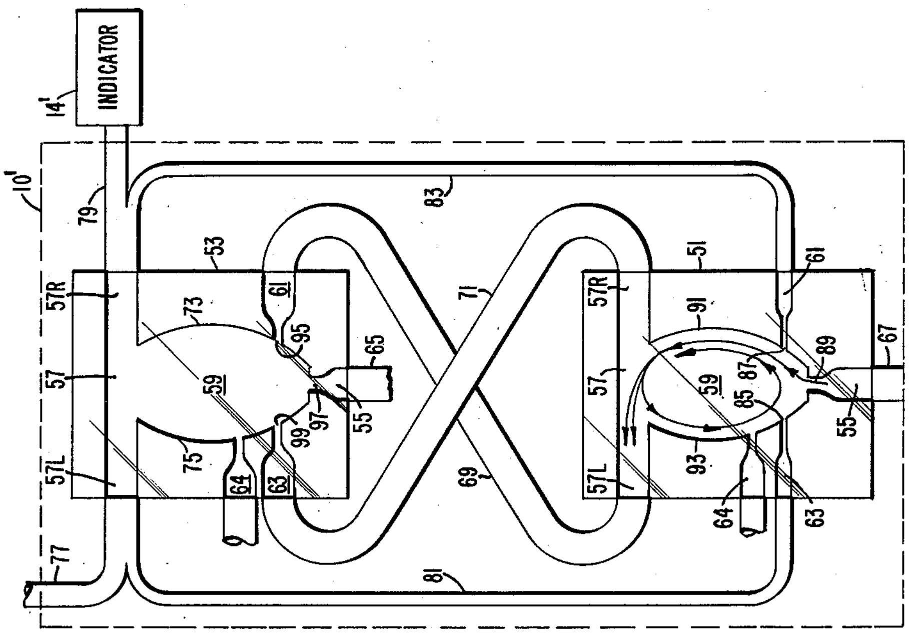
FIGURE 3 shows a second embodiment of the invention.

FIGURE 3 shows a second embodiment of the invention wherein two identical vortex amplifiers are cross-coupled to form a modulo-2 counter. Each of the amplifiers 51 and 53 comprises a power stream input channel 55, an output channel 57, a vortex chamber 59 and right and left control stream input channels 61 and 63. In addition, each amplifier 53 is provided with a reset input channel 64 which is similar to the channels 6 and 30 of FIGURE 1 and operates to reset the amplifier.

The power stream input channel of vortex amplifier 53 is connected by means of channel 65 to a power source which supplies a substantially constant stream of fluid. The power source may be similar to source 37 of FIGURE 1. The power stream input channel of vortex amplifier 51 is connected by means of channel 67 to a source which supplies intermittent fluid pulses. Output channel 57L of amplifier 51 is connected by means of channel 69 to the control stream input channel 61 of amplifier 53 while output channel 57R of amplifier 51 is connected by means of channel 71 to a control signal input channel 63 of amplifier 53.

Vortex amplifier 53 functions in the same manner as the amplifier 3 shown in FIGURE 1. That is, the amplifier has a first or reset state in which its power stream flows along wall 73 and into channel 57L and a second or set state in which the power stream flows along wall 75 and into channel 57R. Once the amplifier is switched to a given state the power stream continues to flow in that state until deflected by a control stream issuing from channel 61 or 63. A control stream issuing from channel 61 deflects the power stream toward wall 75 so that it flows into channel 57R. A control stream flowing in channel 63 deflects the power stream so that it flows along wall 73 and enters channel 57L. The state of the amplifier may be sensed by sensing the flow of fluid in channel 77 or 79.

When amplifier 53 is reset a portion of the fluid flowing in channel 57L enters a feedback channel 81 and is applied to the control stream input channel 63 of amplifier 51. In like manner, when amplifier 53 is set a portion of the fluid flowing in channel 57R is diverted into a feedback channel 83 and applied to the control stream input channel 61 of amplifier 51. The size of channels 81 and 83 is chosen such that the amount of fluid flowing therein and emerging from orifices 85 and 87 is sufficient to influence the direction of flow of a power stream issuing from orifice 89 as the power stream commences but is insufficient to change the direction of flow of a power stream once that flow has been initiated. Considering channel 61, this may be explained as follows.

If fluid is applied to channel 61 and no power stream is emerging from orifice 89 the fluid emerges from orifice 87 and initiates a clockwise vortex flow in chamber 59. The vortex across orifice 89 is sufficient to cause a susequently initiated power stream to flow along wall 93 and into channel 57R.

If the power stream is already flowing along wall 93 at the time a fluid signal is applied to channel 61 then the fluid from channel 61 merely aids the clockwise vortex flow caused by the power stream. On the other hand, if the power stream is flowing along wall 91 at the instant the fluid signal is applied to channel 61 the tendency of the fluid to set up a clockwise vortex flow is opposed by the already existing counterclockwise vortex flow caused by the power stream. Since the amount of fluid emerging from channel 61 is relatively small it is ineffective to reverse the already existing vortex.

The channel 63 functions in a manner similar to that of channel 61 except that fluid emerging from channel 63 tends to set up a vortex in which the flow is counterclockwise.

The arrangement shown in FIGURE 3 is such that the amplifier 53 is switched from one stable state to the other each time a fluid pulse is applied to channel 67. Assume that amplifier 53 is reset with its power stream flowing along the wall 73 and into output channel 57L. A portion of the fluid flowing in channel 57L is conveyed by means of channel 81 to the control stream input channel 63 of amplifier 51. If a pulse is applied to 67 at this time the resulting power stream issuing from orifice 89 is directed toward the wall 91 from whence it flows into output channel 57L. The fluid flowing in channel 57L is conveyed by means of channel 69 to the control stream input channel 61 of amplifier 53. This causes a control stream to emerge from orifice 95 and deflect the power stream emerging from orifice 97 along the wall 75 and into output channel 57R. At this point fluid stops flowing from channel 57L into channels 77 and 81. A portion of the fluid flowing in channel 57R may be conveyed by means of channel 79 to an indicator means 14′ for indicating the state of the counter. A small portion of the fluid flowing in channel 57R passes through channels 83 and 61 and emerges from orifice 87 as a control stream. The control stream emerging from orifice 87 has no effect at this time. If the power stream resulting from the input pulse on channel 67 is still flowing in chamber 59 the control stream is insufficient to change the state of flow of the power stream and vortex in amplifier 51. On the other hand, if the power stream has ceased to flow at this time there is nothing for the control stream to act on.

After the power stream emerging from orifice 89 as a result of the first fluid pulse on lead 67 has terminated a second pulse may be applied to the channel 67. This causes a power stream to again emerge from the orifice 89. The newly initiated power stream is influenced by the control stream from orifice 87 and is directed toward the wall 93 so that it flows into the output channel 57R. The fluid flowing in channel 57R passes through channels 71 and 63 and emerges from orifice 99 to strike the power stream of amplifier 53. This deflects the power stream toward wall 73 so that it again flows into channel 57L.

It is seen therefore that a first pulse applied to channel 67 changes amplifier 53 from a first to a second state and the second pulse applied to channel 67 returns amplifier 53 to its first state.

Figure 4:
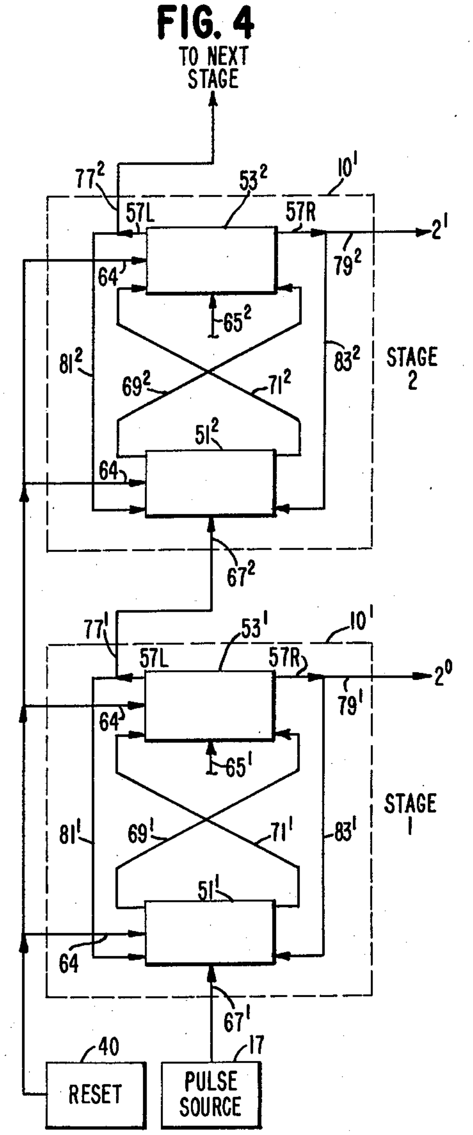
FIGURE 4 is a diagram illustrating the manner in which a plurality of stages such as that shown in FIGURE 3 may be serially connected to form a multistage binary counter.

FIGURE 4 illustrates one manner in which a plurality of modulo-2 counters such as that shown in FIGURE 3 may be interconnected to form a multistage binary counter. Only two stages are shown in FIGURE 4 but it will be obvious to those skilled in the art that additional stages may be added as desired.

The zero or reset condition of the counter shown in FIGURE 4 is evidenced by the following conditions. There is no power stream flowing in the amplifier 51$^1$. The power stream of amplifier 53$^1$ is flowing into output channel 57L thus applying fluid to the control stream input of amplifier 51$^1$ over channel 81$^1$ and the power stream input of amplifier 51$^2$ over channels 77$^1$ and 67$^2$. The power stream of amplifier 51$^2$ is flowing into channel 71$^2$ thus applying a control stream to amplifier 53$^2$ which deflects the power stream of this amplifier so that it flows through output channel 57L and applies a control stream to the amplifier 51$^2$ over channel 81$^2$. These conditions are obtained by applying a fluid reset pulse from source 40 to the channels 64 of each amplifier.

Assume now that the first fluid pulse from source 17 is applied to the power stream input channel 67$^1$ of amplifier 51$^1$. The fluid flowing in channel 81$^1$ at the time the power stream is initiated directs the power stream so that it flows into the channel 69$^1$. The fluid flowing in channel 69$^1$ is applied to a control stream input of amplifier 53$^1$ thus switching the power stream of this amplifier so that it flows into output channel 57R. A portion of the fluid flowing in channel 57R passes by way of channel 83$^1$ to a control signal input of amplifier 51$^1$ but has no effect at this time. A major portion of the fluid flowing in channel 57R passes through channel 79$^1$ and is applied to an indicating device (not shown) to indicate that stage 1 of the counter contains a count of 1.

When the power stream of amplifier 53$^1$ is directed into output channel 57R fluid stops flowing in channels 57L, 81$^1$ and 77$^1$. As a result, the power stream of amplifier 51$^2$ ceases to flow. Since the power stream of amplifier 51$^2$ stops flowing there is no control stream input signal applied to amplifier 53$^2$ over the channel 69$^1$. However, this does not effect the state of amplifier 53$^2$ and it remains in the reset condition.

When pulse source 17 applies a second pulse to the power stream input channel of amplifier 51$^1$ the power stream is directed into channel 71$^1$ because fluid is flowing in channel 83$^1$. The fluid flowing into channel 71$^1$ is applied to the control stream input channel of amplifier 53$^1$ which causes the power stream of this amplifier to be deflected to the output channel 57L. At this point fluid stops flowing in channels 57R, 79$^1$ and 83$^1$.

A portion of the fluid flowing in channel 57L is applied to a control stream input of amplifier 51$^1$ by way of channel 81$^1$ but has no effect at this time. However, that portion of the fluid flowing in channel 57L which enters channel 77$^1$ causes the power stream to be initiated in amplifier $51^2$. Since fluid is flowing in channel $81^2$ at this time the power stream of amplifier $51^2$ is directed into channel $69^2$ and is applied to a control stream input of amplifier $53^2$ to deflect the power stream of this amplifier into output channel 57R. At this time fluid stops flowing in channels 57L, $77^2$ and $81^2$ of stage 2.

When fluid flows in channel 57R of stage 2 a portion of the fluid is diverted into channel $83^2$ and applied to amplifier $51^2$ but has no effect at this time. The remainder of the fluid flowing in channel 57R passes through channel $79^2$ to indicate that stage 2 is set and contains a count of $2^1=2$.

When pulse source 17 applies a third pulse to the power stream input channel of amplifier $51^1$ the fluid flowing in channel $81^1$ directs the power stream into channel $69^1$. As with the first pulse from source 17, this causes the power stream of amplifier $53^1$ to switch and fluid flow stops in channels 57L, $77^1$ and $81^1$ but begins in channels 57R, $79^1$ and $83^1$.

Fluid flow in channel $83^1$ at this time does not affect amplifier $51^1$. Fluid flow in channel $79^1$ indicates that stage 1 is set and contains a count of $2^0=1$.

When fluid stops flowing in channel $77^1$ there is no power stream in amplifier $51^2$ so fluid stops flowing in channel $69^2$. This has no effect on amplifier $53^2$ and it remains set because of the vortex flow in its fluid chamber. Thus, stage 2 continues to produce an indication in channel $79^2$ that it contains a count of two and the total count in the counter is $2^0+2^1=3$.

If a fourth pulse is applied to the power stream input of amplifier $51^1$ both stages of the counter are reset and stage 2 produces a signal in channel $77^2$ which may be applied to still another counter stage.

The reset is accomplished as follows. The fourth pulse on channel $67^1$ creates a power stream in amplifier $51^1$. This power stream is directed into channel $71^1$ by fluid flowing from channel $83^1$. Fluid flow in channel $71^1$ creates a control stream which deflects the power stream of amplifier $53^1$ so that it flows into channels 57L, $77^1$ and $81^1$.

Fluid flowing in channel $77^1$ initiates a power stream in amplifier $51^2$, this power stream being directed into channel $71^2$ because of the fluid flow in channel $83^2$ at this time. The fluid flow in channel $71^2$ creates a control stream which deflects the power stream of amplifier $53^2$ into channels 57L, $77^2$ and $81^2$.

Thus, after every fourth input pulse to amplifier $51^1$ the counter of FIGURE 4 returns to its initial state. It will be obvious to those familiar with binary counters that additional stages may be connected in series in order to increase the counting capacity of the counter.

While preferred embodiments of the invention have been described herein obvious modifications in the form and detail of the devices illustrated may be made without departing from the spirit of the invention. It is intended therefore to be limited only by the scope of the appended claims.

I claim:

1. A bistable device comprising: first and second pure fluid amplifiers each having at least a power stream input channel, an output channel, and a vortex interaction chamber connecting said power stream input channel to said output channel in a region intermediate the ends of said output channel, said second fluid amplifier having first and second fluid control signal input channels for selectively deflecting a power stream entering the chamber of said second amplifier into the output channel in a first or a second direction, respectively; first means connecting the ends of the output channel of said first amplifier to said first and second fluid control signal input channels of said second amplifier; second means for connecting the ends of the output channel of said second amplifier to said first amplifier to control a power stream entering the chamber of said first amplifier to flow into said output channel of said first amplifier in a first or a second direction; and means connected to the output channel of said second amplifier for sensing the state of said second amplifier.

2. A bistable device as claimed in claim 1 and further compirsing means for continuously applying a fluid power stream to the power stream input channel of said second amplifier, and means for intermittently applying a fluid pulse to the power stream input channel of said first amplifier.

3. A binary counter comprising a plurality of bistable devices as claimed in claim 1; means connecting the output channel of the second fluid amplifier in each of said bistable devices to the power stream input channel of the first fluid amplifier in the next higher order bistable device; means for continuously applying a fluid power stream to the power stream input channel of the second amplifier in each of said bistable devices; and means for applying intermittent fluid pulses to the power stream input channel of the first amplifier in the lowest order bistable device.

4. A bistable device as claimed in claim 1 wherein said second means comprises a first fluid conveying means connecting one end of the output channel of said second fluid amplifier to one end of the output channel of said first fluid amplifier and second fluid conveying means connecting the other end of the output channel of said second fluid amplifier to the other end of the output channel of said first fluid amplifier.

5. A bistable device as claimed in claim 1 wherein said first fluid amplifier has first and second control signal input channels and said second means comprises a first fluid conveying means connecting one end of the output channel of said second fluid amplifier to said first control signal input channel of said first fluid amplifier and a second fluid conveying means connecting the other end of the output channel of said second fluid amplifier to said second control signal input channel of said first fluid amplifier.

6. A binary counter comprising: a first vortex amplifier having a power stream input channel, an output channel, and a vortex chamber interconnecting said input channel and said output channel whereby a power stream applied to said input channel flows through said output channel in a first or a second direction; a second vortex amplifier having a power stream input channel, an output channel and a vortex chamber interconnecting said input channel and said output channel whereby a power stream applied to said input channel flows through said chamber and into said output channel in a first or a second direction; first and second fluid control signal input channels terminating at orifices in opposing walls of the vortex chamber of said second amplifier; fluid conveying means connecting said first and second fluid control signal input channels to the output channel of said first amplifier whereby fluid flowing in said first direction in the output channel of said first amplifier is conveyed to said first fluid control signal input channel and fluid flowing in said second direction in the output channel of said first amplifier is conveyed to said second fluid control signal input channel; and means for controlling the direction in which a power stream applied to said first amplifier flows into the output channel of said first amplifier, said means comprising feedback means for applying a portion of the fluid flowing in said first direction in said second amplifier output channel to said first amplifier output channel to cause said first amplifier power stream to flow in said second direction and for applying a portion of the fluid flowing in said second direction in said second amplifier output channel to said first amplifier output channel to cause said first amplifier power stream to flow in said first direction.

7. A binary counter as claimed in claim 6, means for intermittently applying fluid pulses to the power stream input channel of said first amplifier; means for continuously applying a power stream to the power stream input channel of said second amplifier, and means for sensing the direction of fluid flow in the output channel of said second amplifier, said feedback means feeding back fluid sufficient to control the direction of flow of the power stream of said first amplifier when it begins to flow as a result of the application of one of said fluid pulses but insufficient to control the direction of flow of the power stream of said first amplifier once said power stream begins to flow into the output channel of said first amplifier.

8. A binary counter as claimed in claim 6 wherein a portion of the fluid applied to said first amplifier output channel by said feedback means enters the vortex chamber of said first amplifier to create a vortex flow therein, said vortex flow being in one direction if said fluid is applied to said first amplifier output channel in said first direction and in the opposite direction if said fluid is applied to said first amplifier output channel in said second direction, said vortex flow resulting from said feedback being sufficient to control the direction of flow of said first amplifier power stream at the instant said power stream is initiated but insufficient to control the direction of flow of said power stream after it has begun to flow.

9. A binary counter stage comprising: first and second bistable fluid amplifiers each having a power stream input channel, an output channel having first and second substantially coaxially disposed legs, and a vortex chamber connecting the power stream input channel to both legs of said output channel whereby a power stream flowing in said power stream input channel may flow into either leg of said output channel and fluid applied to said legs in a reverse direction may create a vortex flow in said vortex chamber; means for continuously applying a stream of fluid to the power stream input channel of said second amplifier; means for intermittently applying fluid pulses to the power stream input channel of said first amplifier; fluid conveying means connecting the legs of the output channel of said second amplifier to the legs of the output channel of said first amplifier to thereby create a vortex flow in said first amplifier vortex chamber, said vortex flow being sufficient to control a power stream newly initiated by one of said intermittent fluid pulses so that said power stream flows into either said first or said second leg of the output channel of said first amplifier but insufficient to control a power stream once it begins to flow into either leg of said output channel; first and second control signal input means for said second amplifier responsive to fluid flowing in said first or said second leg, respectively, of said first amplifier for deflecting the power stream of said second amplifier to flow in said first or said second output channel leg of said second amplifier; and means for sensing fluid flow in the output channel of said second amplifier.

10. A binary counter stage as claimed in claim 9 wherein said fluid conveying means comprises a first channel for conveying a portion of the power stream flowing in said first leg of the output channel of said second amplifier to the first leg of the output channel of said first amplifier to thereby cause the power stream of said first amplifier to flow into said second leg of the output channel of said first amplifier, and a second channel for conveying a portion of the power stream flowing in said second leg of the output channel of said second amplifier to the second leg of the output channel of said first amplifier to thereby cause the power stream of said first amplifier to flow into said first leg of the output channel of said first amplifier.

11. A multistage binary counter comprising a plurality of stages as claimed in claim 10 wherein said means for intermittently applying fluid pulses to the power stream input channel of said first amplifier comprises means for intermittently applying pulses to be counted to the power stream input channel of the first amplifier of the stage of least binary significance, and means connecting the output channel of said second amplifier in each stage to the power stream input channel of the first amplifier in the stage of next higher binary significance.

12. A binary counter stage comprising: first and second fluid vortex amplifiers each having a power stream input channel, an output channel having first and second legs, a vortex chamber connecting said power stream input channel to said output channel whereby a power stream may flow into said first leg or said second leg, and first and second control stream input channels terminating at orifices in said chamber for selectively directing said power stream toward said first or said second leg of said output channel; first means for conveying fluid from the output channel of said first amplifier to said first and second control signal input channels of said second amplifier; second means for conveying sufficient fluid from the output channel of said second amplifier to the control stream input channels of said first amplifier to control a newly initiated power stream in said first amplifier so that it flows into said first or said second leg of the output channel thereof, said second means conveying insufficient fluid to control the power stream of said first amplifier once said power stream begins to flow into the output channel of said first amplifier; means for continuously applying a stream of fluid to the power stream input channel of said second amplifier; means for intermittently applying fluid pulses to the power stream input channel of said first amplifier; and means for sensing the flow of fluid in the output channel of said second amplifier.

13. A binary counter stage comprising: a first fluid amplifier having a first power stream input channel, a first output channel having first and second legs, a first vortex chamber connecting said first power stream input channel to said first and second legs, and first and second control stream input channels terminating at orifices in said first vortex chamber, said first orifice being positioned such that a control stream issuing therefrom tends to direct a power stream from said first power stream input channel into said first leg and said second orifice being positioned such that a control stream issuing therefrom tends to direct a power stream from said first power stream input channel into said second leg; a second fluid amplifier having a second power stream input channel, a second output channel having third and fourth legs, a second vortex chamber connecting said second power stream input channel to said third and fourth legs, and third and fourth control stream input channels terminating at orifices in said second vortex chamber, said third orifice being positioned such that a control stream issuing therefrom directs a power stream from said second power stream input channel into said third leg and said fourth orifice being positioned such that a control stream issuing therefrom directs a power stream from said second power stream input channel into said fourth leg; first fluid conveying means connecting said first leg to said fourth control stream input channel; second fluid conveying means connecting said second leg to said third control signal input channel; third fluid conveying means connecting said third leg to said first control signal input channel; fourth fluid conveying means connecting said fourth leg to said second control signal input channel; means for continuously applying a fluid stream to said second power stream input channel; means for intermittently applying a power stream to said first power stream input channel, said third and fourth fluid conveying means conveying sufficient fluid to said first and second control signal input channels to control the direction of flow of a newly initiated power stream from said first power stream input channel but conveying insufficient fluid to change the direction of flow of said first power stream once it begins to flow into said first or second leg.

14. A multistage binary counter comprising a plurality of stages as claimed in claim 13, said means for intermittently applying a power stream to said first power stream input channel comprising means for applying fluid pulses to be counted to said first power stream input channel of the stage of least binary significance, and means connecting said third leg of each of said stages to said first power stream input channel of the stage of next higher binary significance.

15. A multistage binary counter as claimed in claim 14 and further comprising means responsive to fluid flow in said fourth leg of each of said stages for indicating the count in said counter.

16. A bistable device comprising: means having a chamber therein for creating a vortex flow of fluid applied thereto; an output channel, said chamber intersecting said output channel at a point intermediate its ends whereby fluid flowing in said chamber may enter said channel and flow therethrough in a first or a second direction; first means for selectively applying fluid to said output channel in a direction whereby said fluid flows through said output channel toward said intermediate point and then into said chamber to create a control vortex flow in said chamber; and means for selectively applying a fluid power stream to said chamber, said control vortex flow in said chamber causing said power stream fluid to assume a path of flow which reinforces said control vortex flow.

17. A bistable device as claimed in claim 16 wherein said first means comprises means for selectively applying sufficient fluid through said output channel to said chamber to create a control vortex flow sufficient to cause a newly applied power stream to assume a path of flow which reinforces said control vortex flow, said applied fluid being insufficient to change the vortex flow once said power stream has assumed a path of flow.

18. A bistable device as claimed in claim 16 wherein said first means includes first control means for applying fluid to said output channel in said first direction to create a control vortex flow in one direction sufficient to cause a newly applied power stream to reinforce said control vortex in said one direction and flow into said output channel in said first direction and second control means for applying fluid to said output channel in said second direction to create a control vortex flow in a different direction sufficient to cause a newly applied power stream to reinforce said control vortex in said different direction and flow into said output channel in said second direction.

19. A bistable device as claimed in claim 18 wherein said first and second control means include means for limiting fluid flow into said output channel to less than a predetermined amount, said predetermined amount being the maximum flow into said output channel which does not destroy a vortex flow in said chamber which is being reinforced by said power stream.

20. A bistable device as claimed in claim 4 and further comprising: means for continuously applying a fluid power stream to the power stream input channel of said second amplifier, and means for intermittently applying a fluid pulse to the power stream input channel of said first amplifier.

21. A bistable device as claimed in claim 5 and further comprising: means for continuously applying a fluid power stream to the power stream input channel of said second amplifier, and means for intermittently applying a fluid pulse to the power stream input channel of said first amplifier.

22. The method of switching a bistable fluid amplifier of the type wherein a power stream injected into a bounded fluid chamber is selectively directed from a first output channel toward a second output channel under the control of a fluid signal applied to said chamber through a control signal input channel, said amplifier being of the type wherein said power stream is maintained in a first or a second stable state of flow through said chamber by fluid forces created by said injected power stream, said method comprising the steps of applying to said chamber through said control signal input channel a fluid control signal of a magitude insufficient to change the state of power stream flow as long as said fluid forces are present, terminating said injected power stream, and subsequently initiating said power stream, said applied control stream being of sufficient magnitude to determine the state of flow of said power stream as said power stream is initiated.

23. The method as claimed in claim 22 wherein said fluid control signal is applied to said chamber through said control signal input channel before said power stream is terminated and is applied until after said power stream is subsequently initiated.

24. The method as claimed in claim 22 wherein said fluid control signal is applied to said chamber through said control signal input channel between the time said power stream is terminated and subsequently initiated and is applied until after said power stream is subsequently initiated.

25. The method of controlling the direction of flow of a fluid stream injected into a chamber of the type having a configuration whereby fluid forces created by said stream act against said stream to hold it in a first or a second stable path of flow along a first or a second wall, said method comprising the steps of intermittently terminating and then initiating said injected stream and applying a fluid control signal to said chamber through one of said walls and adjacent the region where said stream is injected into said chamber, said fluid control signal being of sufficient magnitude to determine the direction of flow of said stream as said stream is initiated but of insufficient magnitude to overcome said fluid forces and change the path of flow of said stream once said stream has begun to create said forces.

26. The method as claimed in claim 25 wherein said fluid control signal is applied before said stream is terminated and is continuously applied until after said stream is initiated.

27. The method as claimed in claim 26 wherein said fluid control signal is applied after said stream is terminated and is continuously applied until after said stream is initiated.

28. The combination comprising: means defining a fluid chamber shaped to maintain a power stream injected into said chamber in a first or a second stable path of flow; means defining a power stream input channel connected to said chamber; means defining first and second output channels connected to said chamber for receiving an injected power stream when it is flowing in said first or said second stable path of flow, respectively; means defining a control signal input channel connecting with said chamber; means for applying to said chamber through said control signal input channel a fluid control signal of a magnitude insufficient to change said power stream from said first to said second stable path of flow but of a magnitude sufficient to induce said power stream to assume said second stable path of flow at the instant said power stream is initiated; and pulse source means connected to said power stream input channel for intermittently terminating said power stream and subsequently initiating it in the presence of said fluid control signal.

29. The combination comprising: a bistable fluid vortex amplifier of the type having a power stream input channel, an output channel, a vortex chamber connecting said power stream input channel to said output channel at a point intermediate the ends of said output channel whereby fluid may flow from said power stream input channel through said chamber and into said output channel in a first or a second direction, and a control signal input channel connected to said chamber; means for intermittently applying a fluid control signal to said control signal input channel to create in said chamber a control vortex flow of insufficient magnitude to change the state of power stream flow but of sufficient magnitude to deflect said power stream at the instant it is initiated; and means connected to said power stream input channel for intermittently initiating and terminating power stream flow.

30. The combination comprising: a fluid vortex amplifier having a power stream input channel, an output channel, a vortex chamber connecting said power stream input channel to said output channel at a point intermediate the ends of said output channel whereby fluid may flow from said power stream input channel through said chamber and into said output channel in a first or a second direction, and a control signal input channel terminating at an orifice in said chamber, said orifice being positioned to direct fluid across the path of a power stream immediately downstream from where said power stream input channel connects with said chamber; means connected to said power stream input channel for intermittently terminating and initiating a power stream; and means for applying to said chamber through said control signal input channel a fluid control signal having a predetermined magnitude M, where $M_1 \geqq M \leqq M_2$, $M_2$ represents the maximum magnitude a control signal may have and still not change the direction of power stream flow into said output channel, and $M_1$ represents the minimum magnitude a control signal may have and still induce said power stream to flow toward said output channel in a predetermined direction at the instant said power stream is initiated.

References Cited by the Examiner

UNITED STATES PATENTS

| | | | |
|---|---|---|---|
| 3,001,698 | 9/61 | Warren | 235—61 |
| 3,024,805 | 3/62 | Horton | 235—61 |
| 3.057,551 | 10/62 | Etter | 235—61 |
| 3,107,850 | 10/63 | Warren | 235—201 |
| 3,128,038 | 4/64 | Norwood | 235—201 |

FOREIGN PATENTS

| | | |
|---|---|---|
| 1,318,907 | 1/63 | France. |

OTHER REFERENCES

Article—"Performance Evaluation of a High-Pressure Recovery Bistable Fluid Amplifier," by W. A. Boothe, A.S.M.E. Proceedings, Nov. 28, 1962, pages 83–90.

LEO SMILOW, *Primary Examiner.*